United States Patent
Ikehara

(10) Patent No.: US 8,357,950 B2
(45) Date of Patent: Jan. 22, 2013

(54) SEMICONDUCTOR LIGHT EMITTING DEVICE, SEMICONDUCTOR ELEMENT, AND METHOD FOR FABRICATING THE SEMICONDUCTOR LIGHT EMITTING DEVICE

(75) Inventor: Masahiro Ikehara, Nara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 532 days.

(21) Appl. No.: 11/646,809

(22) Filed: Dec. 27, 2006

(65) Prior Publication Data

US 2007/0145401 A1 Jun. 28, 2007

(30) Foreign Application Priority Data

Dec. 27, 2005 (JP) .................. 2005-376478
Oct. 23, 2006 (JP) .................. 2006-288059

(51) Int. Cl.
*H01L 33/00* (2010.01)

(52) U.S. Cl. ............. 257/99; 257/13; 257/98; 257/100; 257/E33.056; 257/E33.072

(58) Field of Classification Search ............ 257/98–100, 257/E51.018, 13
See application file for complete search history.

(56) References Cited

U.S. PATENT DOCUMENTS

| 5,481,082 A * | 1/1996 | Yamamoto ............... 219/121.63 |
| 7,015,583 B2 | 3/2006 | Ishii et al. |
| 7,411,225 B2 * | 8/2008 | Kim et al. ................... 257/100 |
| 7,824,937 B2 * | 11/2010 | Suehiro et al. ............... 438/26 |
| 2001/0032985 A1 * | 10/2001 | Bhat et al. ................. 257/88 |
| 2005/0067636 A1 * | 3/2005 | Amoh et al. ............... 257/232 |
| 2005/0133795 A1 | 6/2005 | Park et al. |
| 2005/0199887 A1 * | 9/2005 | Suehiro et al. ............... 257/79 |
| 2006/0022216 A1 | 2/2006 | Chikugawa |
| 2006/0180828 A1 * | 8/2006 | Kim et al. ................... 257/100 |
| 2006/0220050 A1 * | 10/2006 | Higaki et al. ............... 257/99 |
| 2006/0261364 A1 * | 11/2006 | Suehiro et al. ............... 257/100 |
| 2007/0001315 A1 * | 1/2007 | Yokoyama et al. ........... 257/779 |
| 2007/0075306 A1 * | 4/2007 | Hayashi et al. ................ 257/13 |
| 2008/0006837 A1 * | 1/2008 | Park et al. ...................... 257/98 |
| 2008/0035947 A1 * | 2/2008 | Weaver, Jr. et al. ............ 257/99 |
| 2008/0252212 A1 * | 10/2008 | Suehiro et al. ............... 313/512 |

FOREIGN PATENT DOCUMENTS

| JP | 9-293904 | 11/1997 |
| JP | 10-170769 | 6/1998 |
| JP | 10-288966 | * 10/1998 |
| JP | 11-284281 A | 10/1999 |
| JP | 2002-368020 A | 12/2002 |
| JP | 2003-8083 A | 1/2003 |
| JP | 2003-046137 | 2/2003 |

(Continued)

*Primary Examiner* — A. Sefer
(74) *Attorney, Agent, or Firm* — Morrison & Foerster LLP

(57) ABSTRACT

In the semiconductor light emitting device of the present invention, a reflective layer for reflecting light emitted by a semiconductor light emitting element is formed on a Cu wiring pattern, and a bonding section is formed on a light-emitting-element-mounting area on the Cu wiring pattern, to which an electrode of an LED chip is connected, the bonding section being made of a material allowing the semiconductor light emitting element to be soldered on the reflective layer without flux. Consequently, it is possible to realize a high-quality semiconductor light emitting device which has a semiconductor light emitting element firmly attached to a bonding surface and which is capable of emitting light while reducing deterioration in luminosity and color tone shift.

21 Claims, 10 Drawing Sheets

FOREIGN PATENT DOCUMENTS

| | | |
|---|---|---|
| JP | 2003-152226 | 5/2003 |
| JP | 2004-311857 A | 11/2004 |
| JP | 2005-183909 | 7/2005 |
| JP | 2006-66504 * | 3/2006 |
| WO | WO-01/47036 A1 | 6/2001 |

* cited by examiner

| | Resin 1 |
|---|---|
| | Resin 2 |
| | P-resin 1 |
| | P-resin 2 |
| | AuSn |
| | Cu |
| | Ag |
| | Au |

10

| | |
|---|---|
| ▒ | Resin 1 |
| ░ | Resin 2 |
| ▒ | P-resin 1 |
| ░ | P-resin 2 |
| ▨ | AuSn |
| ▨ | Cu |
| ▨ | Ag |
| ■ | Au |

US 8,357,950 B2

SEMICONDUCTOR LIGHT EMITTING DEVICE, SEMICONDUCTOR ELEMENT, AND METHOD FOR FABRICATING THE SEMICONDUCTOR LIGHT EMITTING DEVICE

This non-provisional application claims priority under 35 U.S.C. § 119(a) on Patent Application No. 376478/2005 filed in Japan on Dec. 27, 2005, and Patent Application No. 288059/2006 filed in Japan on Oct. 23, 2006, the entire contents of which are hereby incorporated by reference.

FIELD OF THE INVENTION

The present invention relates to a semiconductor light emitting device, including an LED, which is used for a device such as a small illuminating device, a liquid crystal back light, and a camera flash.

BACKGROUND OF THE INVENTION

As a semiconductor light emitting device used for a device such as a small illuminating device, there has been known a semiconductor light emitting device 100 in which, as illustrated in FIG. 8(a), a reflective wall is formed around an LED (light emitting diode) chip 10 which is a semiconductor light emitting element, so as to reflect in an above direction light emitted sideward by the LED chip 10. FIG. 8(b) is a cross sectional drawing taken in C-C' line of the semiconductor light emitting device 100 in FIG. 8(a).

As illustrated in FIGS. 8(a) and 8(b), in the conventional semiconductor light emitting device 100, the LED chip 10 is formed on a Cu wiring pattern (bonding surface) 16 on a first insulating resin layer 11. A reflective layer 17 made of Ag plating is formed on the Cu wiring pattern. The reflective layer 17 is used for reflecting light from the LED chip 10.

In forming the semiconductor light emitting device 100, in a case of bonding (die-bonding) the LED chip 10 with a bonding surface, Ag paste is used, which is described in Document 1 (Japanese Unexamined Patent Publication No. 311857/2004 (Tokukai 2004-311857; published on Nov. 4, 2004)). However, as illustrated in FIG. 9, if a P-N junction of the LED chip 10 is near a die-bonding surface, a leakage occurs in bonding by Ag paste 101 or the like. Therefore, solder such as AuSn is thinly attached in advance to a die-bonding-side electrode 23 of the LED chip 10 before carrying out die-bonding. At that time, a material for a surface on which the LED chip 10 is to be die-bonded is generally Au in terms of easiness and reliability of die-bonding.

However, in order to emit white light, it is necessary to use a material whose reflectance is high in all ranges of visible light. For example, as described in Document 2 (Japanese Unexamined Patent Publication No. 46137/2003 (Tokukai 2003-46137; published on Feb. 14, 2003)), Ag is used for a surface which reflects light emitted by an LED in a semiconductor light emitting device. However, because of an oxidized layer on an Ag surface, it is difficult to solder the LED chip to Ag. Consequently, as described in Document 2, reflection of light by Ag is impossible on a die-bonding surface. In Document 2, a side wall of an LED package is plated with Ag, but a portion to which the LED chip is die-bonded is not plated with Ag. Emitted light is reflected not only by the side wall but also by a bottom surface. Therefore, if the bottom surface is not plated with Ag, luminosity deteriorates and color tone deteriorates.

Alternatively, in order to obtain a high reflectance by plating a die-bonding surface with Ag, flux is used in die-bonding so as to allow die-bonding on an Ag oxidized film.

Here, functions of flux are the following (1) to (3).

(1) Surface cleaning: to chemically remove an oxidized film on a metal surface (reduction) and make the metal surface clean so that soldering is possible.
(2) Drop of interfacial tension: to reduce a surface tension of molten solder and improve solder wetting.
(3) Prevention of reoxidization: to cover the metal surface in soldering and prevent the metal surface from being in contact with air so as to prevent reoxidization of the metal surface due to heating.

The following explains a conventional method in which die-bonding is performed by use of flux. In order to obtain a high reflectance of Ag on a die-bonding surface while using an LED chip whose P-N junction is near the die-bonding surface in the conventional method, a AuSn solder layer 24 is formed on the die-bonding side electrode 23 of the LED chip 10 as illustrated in FIG. 10(a). Then, as illustrated in FIG. 10(b), flux 102 is applied in advance onto Ag plating, the LED chip 10 is placed on the flux 102, and AuSn and Ag are bonded with each other by reflow soldering.

However, in the conventional method, the LED chip 10 is die-boded with Ag by use of flux, so that a step of applying flux and a step of cleaning flux are necessary. It takes much time to clean flux, and it is difficult to clean flux off a part having complicated structure. In particular, it is impossible to clean flux remaining in a part sealed by solder, which is a main cause of deterioration in reliability of a semiconductor light emitting device.

Further, in a case of using flux, it is necessary to control timing between reaction of flux and melting of solder with reference to a temperature profile of the flux. As such, very minute temperature control is necessary. In addition, remaining flux causes insufficient bonding. Further, as illustrated in FIG. 10(c), when fluidity of flux near the LED chip 10 drops, gas generated from flux near the center of the LED chip 10 cannot go anywhere. Consequently, a void 103 may be generated at an area to be soldered and bonded. At that time, too, insufficient bonding of the LED chip 10 is caused.

Further, in a conventional semiconductor light emitting device, as described in Document 3: Japanese Unexamined Patent Publication No. 49442/2006 (Tokukai 2006-49442; published on Feb. 16, 2006, corresponding US patent publication: US20060022216A1), when die-bonding is performed without flux, die-boding is performed on a whole of Au plating, so that light is reflected by Au. Consequently, color tone deteriorates due to low reflectance of Au in short wavelength range of visible light.

SUMMARY OF THE INVENTION

The present invention was made in view of the foregoing problems. An object of the present invention is to realize (i) a semiconductor light emitting device which has a semiconductor light emitting element firmly bonded with a bonding surface and which is capable of emitting light while reducing deterioration in luminosity and color tone shift, and (ii) a method for fabricating the semiconductor light emitting device.

In order to achieve the objects, the semiconductor light emitting device of the present invention includes: a semiconductor light emitting element, mounted on a bonding surface; and a reflective layer, formed on the bonding surface, for reflecting light emitted by the semiconductor light emitting element, the bonding surface having thereon a light-emittingelement-mounting area on which a bonding section is formed, and the bonding section being made of a material allowing an electrode of the semiconductor light emitting element to be soldered on the reflective layer without flux.

With the arrangement, the semiconductor light emitting element and the bonding surface on which the reflective layer for reflecting light emitted by the semiconductor light emitting element is formed are soldered to each other via the bonding section made of a material capable of being soldered without flux to the semiconductor light emitting element. Consequently, it is possible to avoid insufficient bonding or insufficient reliability due to flux.

Here, it is preferable to arrange a white or full-color semiconductor light emitting device so that a bonding surface area on which a semiconductor light emitting element such as an LED chip is to be bonded (e.g. sub mount, frame, or substrate) has high reflectance in all wavelength range of visible light so as to reflect light emitted by the semiconductor light emitting element. However, in a conventional method, in order to perform die-bonding without flux, die-boding is performed with a whole surface of the bonding surface being plated with Au. Consequently, in a conventional semiconductor light emitting device, light is reflected by Au. Consequently, color tone deteriorates due to low reflectance of Au in short wavelength range of visible light. Alternatively, if the conventional semiconductor light emitting device is arranged so that color tone is maintained to some extend, luminosity deteriorates instead.

With the arrangement of the present invention, the bonding section is made of a material capable of being soldered without flux to the semiconductor light emitting element, but other area is solely made of the reflective layer for reflecting light emitted by the semiconductor light emitting element. Consequently, light emitted by the semiconductor light emitting element is reflected by the reflective layer, so that luminosity does not deteriorate and color tone does not deteriorate.

Therefore, with the arrangement, it is possible to provide a semiconductor light emitting device which has a semiconductor light emitting element firmly bonded with a bonding surface and which is capable of emitting light while reducing deterioration in luminosity and color tone shift.

Further, in order to achieve the objects, the method of the present invention for fabricating a semiconductor light emitting device is a method for fabricating a semiconductor light emitting device in which a semiconductor light emitting element is mounted on a bonding surface, comprising the steps of: (i) forming, on the bonding surface, a reflective layer for reflecting light emitted by the semiconductor light emitting element; and (ii) forming a bonding section on a light-emitting-element-mounting area on the bonding surface, the bonding section being made of a material allowing an electrode of the semiconductor light emitting element to be soldered on the reflective layer without flux.

With the method, the bonding section made of a material allowing the semiconductor light emitting element to be soldered on the reflective layer without flux is formed on the light-emitting-element-mounting area. Therefore, in bonding the semiconductor light emitting element with the bonding surface, soldering can be performed at the bonding section without flux. It takes very long time to clean flux, which needs equipment for disposing drained liquid. However, with the above method, soldering is performed without flux, so that it is possible to fabricate a semiconductor light emitting device in a shorter time and with lower costs. Further, with the above method, it is possible not only to omit cleaning of flux but also to avoid insufficient bonding and insufficient reliability due to flux.

Further, with the above method, the bonding section is made of a material capable of being soldered without flux to the semiconductor light emitting element, but other area is solely made of the reflective layer for reflecting light emitted by the semiconductor light emitting element. That is, the semiconductor light emitting element is soldered without flux at a portion which does not serve for reflecting light.

Therefore, with the above method, it is possible to fabricate a semiconductor light emitting device which has a semiconductor light emitting element firmly bonded with a bonding surface and which is capable of emitting light while reducing deterioration in luminosity and color tone shift. In this way, with the above method, it is possible to fabricate a semiconductor light emitting device having high quality.

For a fuller understanding of the nature and advantages of the invention, reference should be made to the ensuing detailed description taken in conjunction with the accompanying drawings.

BRIEF DESCRIPTION OF THE DRAWINGS

FIG. 1(b) is a cross sectional drawing illustrating the semiconductor light emitting device in FIG. 1(a).

DESCRIPTION OF THE EMBODIMENTS

Figure 1:
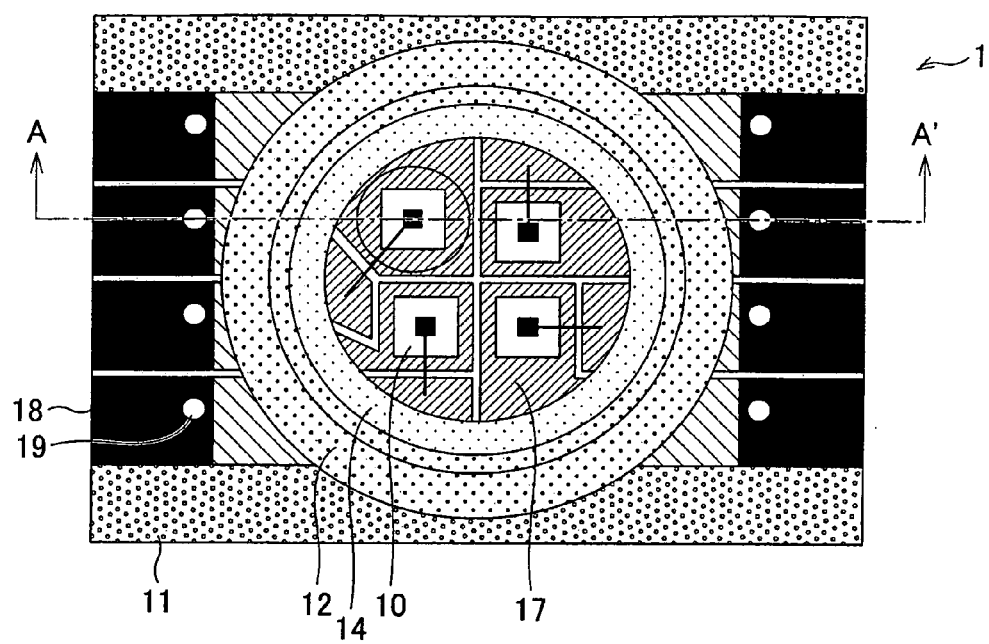
FIG. 1 (a) is a top drawing illustrating a semiconductor light emitting device of an embodiment of the present invention.
Figure 1:
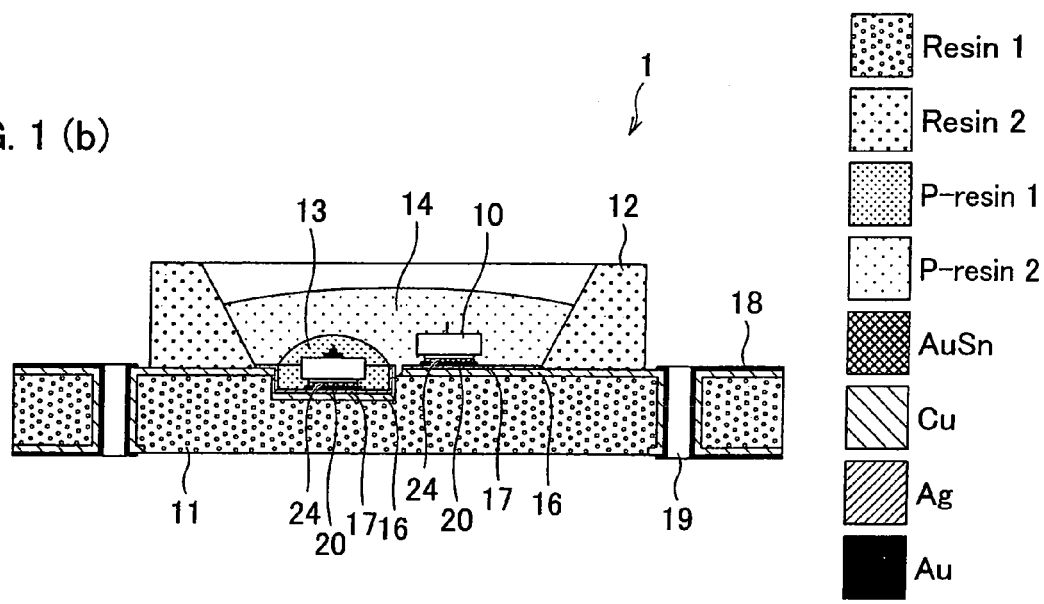
Figure 2:
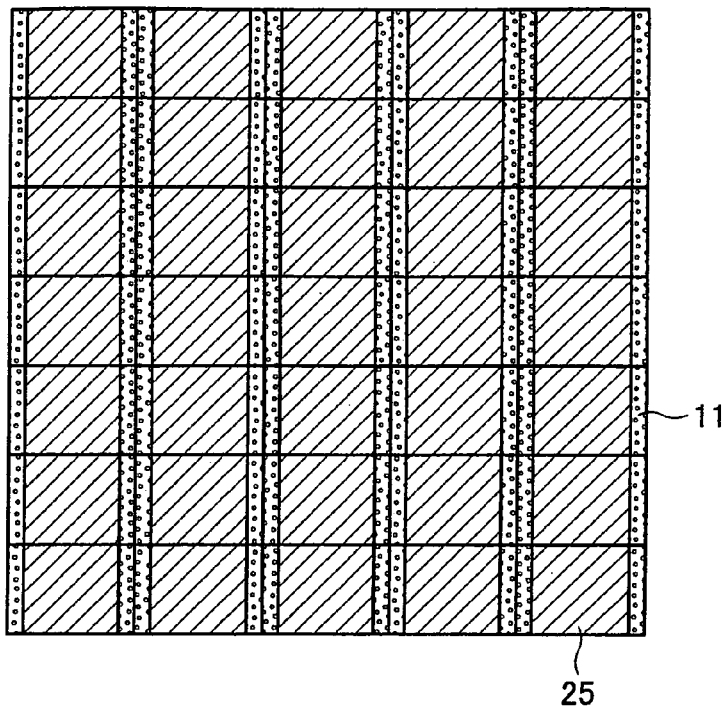
FIG. 2(a) is a drawing indicating a state in which the semiconductor light emitting device is masked so as to be subjected to Au plating.
FIG. 2(b) is an enlarged drawing of FIG. 2(a).
Figure 2:
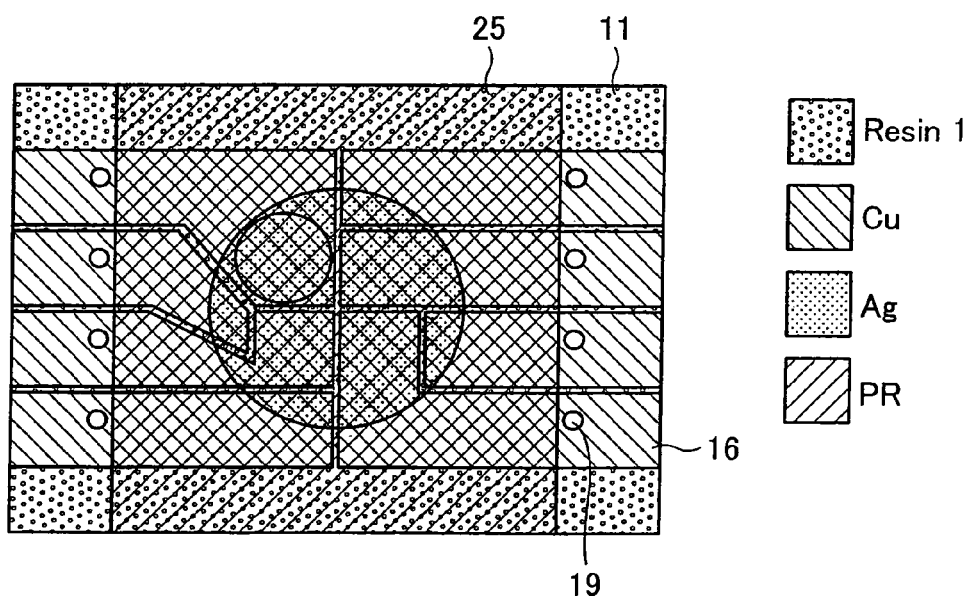

The following explains an embodiment of the present invention with reference to FIGS. 1(a) and 1(b) to 7. Note that, the present invention is not limited to the following explanation. Further, for convenience of explanation, in the embodiment, a direction from a bonding surface to a semiconductor light emitting element is regarded as an upward direction. Further, in the present embodiment, an explanation is made as to a case where a top surface of an electrode of an LED chip, which is a semiconductor light emitting element, is an AuSn solder layer, and the LED chip is directly die-bonded to a substrate (wiring pattern) without intermediation of a sub mount. Note that, the explanation is applicable to a case where an Au thin film is formed on AuSn so as to be a top surface for the purpose of preventing oxidization of AuSn.

As illustrated in FIGS. 1(a) and 1(b), a semiconductor light emitting device 1 of the present embodiment is arranged so that a semiconductor light emitting element 10 is mounted on a Cu wiring pattern (bonding surface) 16 on a first insulating resin layer 11. In the present embodiment, an LED chip is used as the semiconductor light emitting element 10 and therefore the semiconductor light emitting element 10 is referred to as an LED chip 10 hereinafter. Note that, a ceramic substrate having a high thermal conductivity may be used instead of the first insulating resin layer 11. Here, a thermal conductivity of the ceramic substrate is preferably 50 W/mK or more, and further preferably 100 W/mK or more.

A reflective layer 17 is formed on the Cu wiring pattern 16 by Ag plating. The reflective layer 17 is used to reflect light from the LED chip 10.

Further, in the semiconductor light emitting device 1, the LED chip 10 is covered and sealed by light-transmitting resin 14 on an area on which the LED chip 10 is mounted. Further, the light-transmitting resin 14 is surrounded by a second insulating resin layer 12. Here, the light-transmitting resin 14 may be arranged so as to partially cover, in an opening, a side of an opening section of the second insulating resin layer 12.

Further, in the semiconductor light emitting device 1, a metal layer made of Cu is formed on a surface of the first insulating resin layer 11 so as to be opposite to a surface covered with the Cu wiring pattern 16. The Cu wiring pattern 16 and the metal layer made of Cu are electrically connected with each other via a through hole 19. Note that, the through hole 19 is plated with Au. Further, in the semiconductor light emitting device 1, an external terminal connecting section of the Cu wiring pattern 16 is plated with Au.

Note that, the semiconductor light emitting device 1 of the present embodiment may include a plurality of LED chips 10 (four LED chips 10 are provided in FIG. 1(a)). Further, at least one of the plurality of LED chips 10 may be covered with light-transmitting resin 13 including a fluorescent substance which absorbs light from the LED chip 10 and emits light having a longer wavelength.

The above structure is the same as that of a conventional semiconductor light emitting device, and can be made with a known method.

The following explains a characteristic structure of the semiconductor light emitting device 1 of the present embodiment.

In the semiconductor light emitting device 1, a bonding section 20 made of a material capable of being soldered without flux to the LED chip 10 is provided on the Cu wiring pattern 16 so as to correspond to the area on which the LED chip 10 is to be mounted (light-emitting-element-mounting area), and the bonding section 20 is bonded with a die-bonding-side electrode (electrode) 23 of the LED chip 10 via a solder layer 24. Note that, an electrode 22 positioned opposite to the electrode at the bonding surface (die-bonding surface) side is wire-bonded via a metal line. In the present embodiment, the bonding section 20 is made of Au plating.

The LED chip 10 is soldered without flux, so that it is possible to avoid insufficient bonding or insufficient reliability due to flux.

Further, the bonding section is made of a material capable of being soldered without flux to a semiconductor light emitting element, and other area is solely made of the reflective layer 17 which reflects light from the semiconductor light emitting element. Therefore, in the semiconductor light emitting device 1, the semiconductor light emitting element is firmly bonded with the bonding surface without any inconvenience. Further, the semiconductor light emitting device 1 can emit light while reducing deterioration in luminosity and color tone shift.

The following explains a method for fabricating the semiconductor light emitting device 1.

As with a conventional method, the Cu wiring pattern 16 is subjected to Ag plating so that the reflective layer 17 is formed. Here, it is preferable to arrange a white or full-color semiconductor light emitting device so that a bonding surface on which the LED chip 10 is to be bonded (e.g. sub mount, frame, or substrate) has high reflectance in all wavelength range of visible light so as to reflect light emitted from the LED chip 10. For that reason, Ag is preferably used for an area on which the LED chip 10 is to be bonded. In the present embodiment, Ag is used for the reflective layer 17. However, for example, nickel or platinum also may be used for the reflective layer 17. It is preferable to use a material whose reflective characteristics of light are high for the reflective layer 17. Thickness of Ag plating preferably ranges from 1 to 5 μm. However, the thickness is not limited to this range.

As described above, by forming the reflective layer 17, it is possible to reflect light emitted by the LED chip 10 and to efficiently lead the light toward the outside (upper direction of FIG. 1(b)). Consequently, it is possible to make the semiconductor light emitting device 1 be a device having high luminosity.

Figure 3:
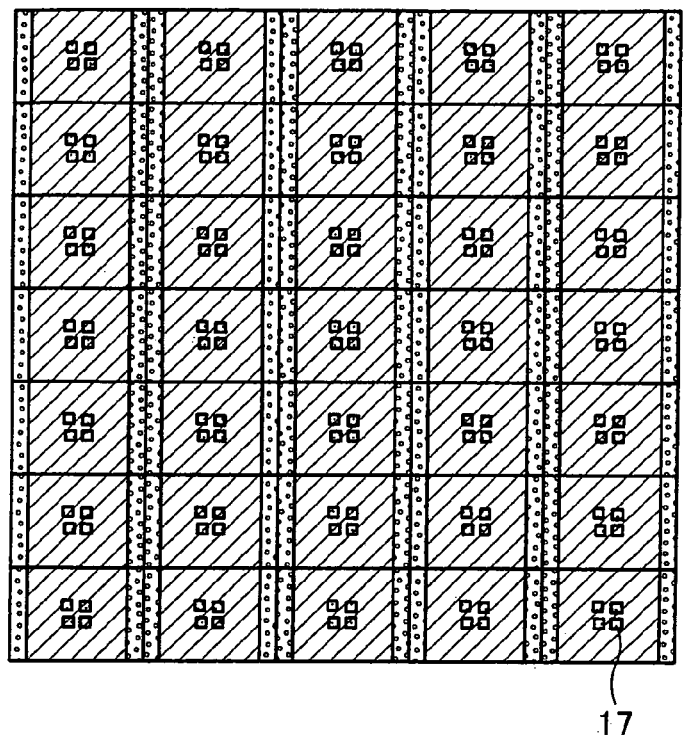
FIG. 3(a) is a drawing indicating a state of semiconductor light emitting device in which openings are made on areas where LED chips are mounted, so as to plate external terminal connecting sections while forming bonding sections.
FIG. 3(b) is an enlarged drawing of FIG. 3(a).
Figure 3:
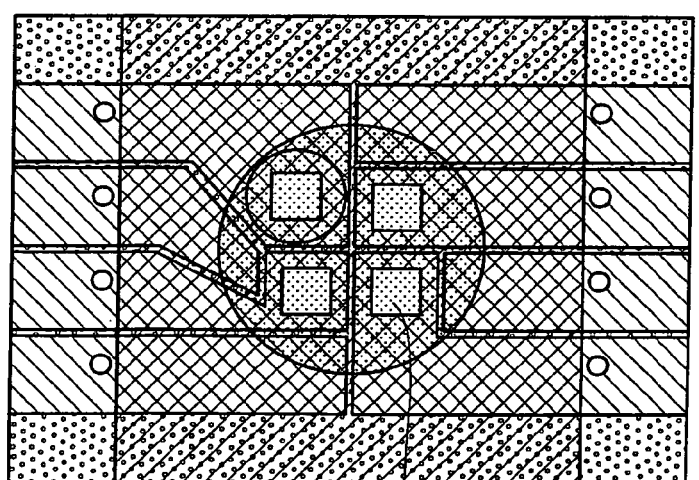
Figure 3:
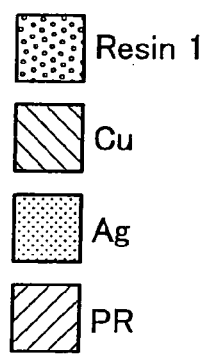
Figure 4:
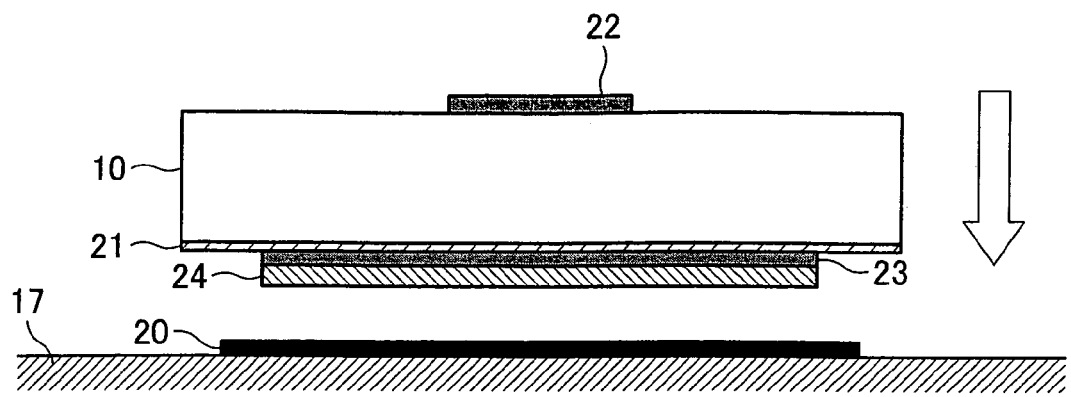
FIG. 4(a) is a drawing illustrating a state in which an LED chip is not yet die-bonded in the semiconductor light emitting device.
FIG. 4(b) is a drawing illustrating a state in which the LED chip is already die-bonded in the semiconductor light emitting device.
Figure 4:
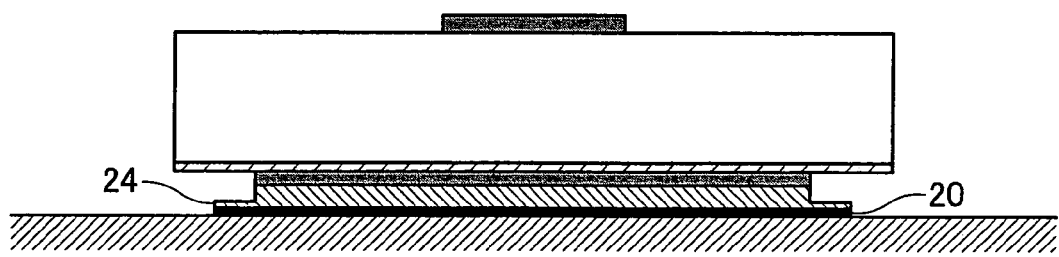
Figure 5:
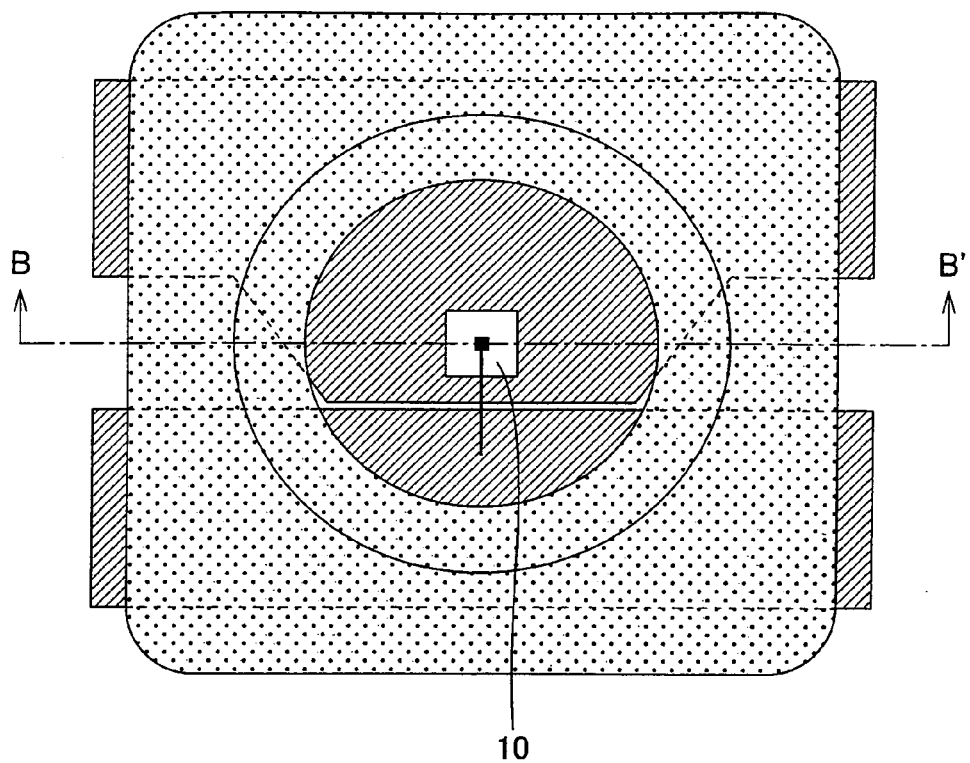
FIG. 5(a) is a top drawing illustrating a semiconductor light emitting device of another embodiment of the present invention, in which resin is inserted and molded in a metal frame.
FIG. 5(b) is a cross sectional drawing illustrating the semiconductor light emitting device in FIG. 5(a).
Figure 5:
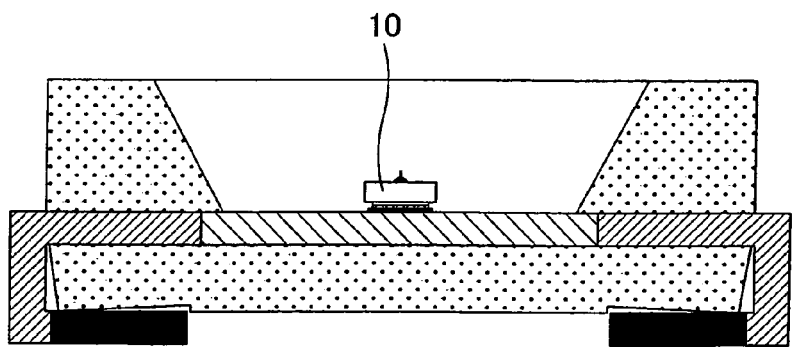
Figure 5:
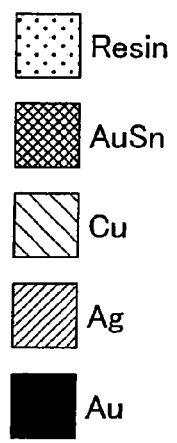
Figure 6:
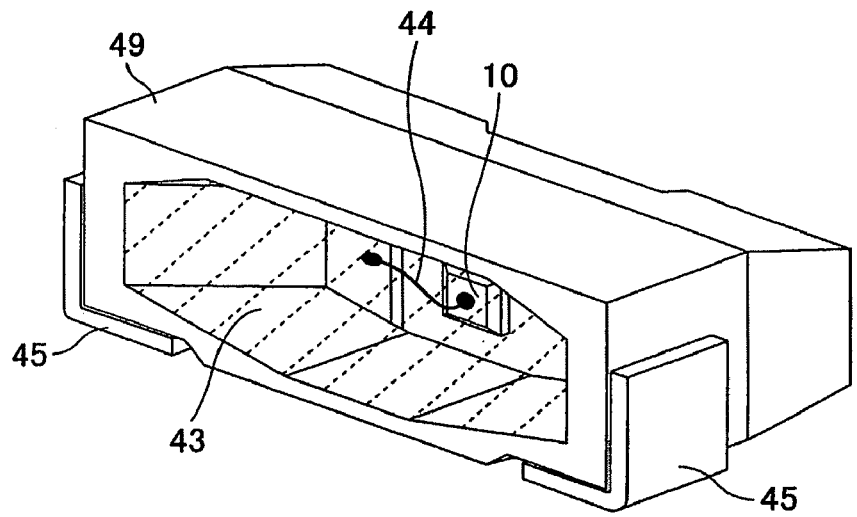
FIG. 6(a) is an oblique drawing illustrating a semiconductor light emitting device of another embodiment of the present invention, in which light is emitted in a side direction.
FIG. 6(b) is a cross sectional drawing illustrating the semiconductor light emitting device in FIG. 6(a).
Figure 6:
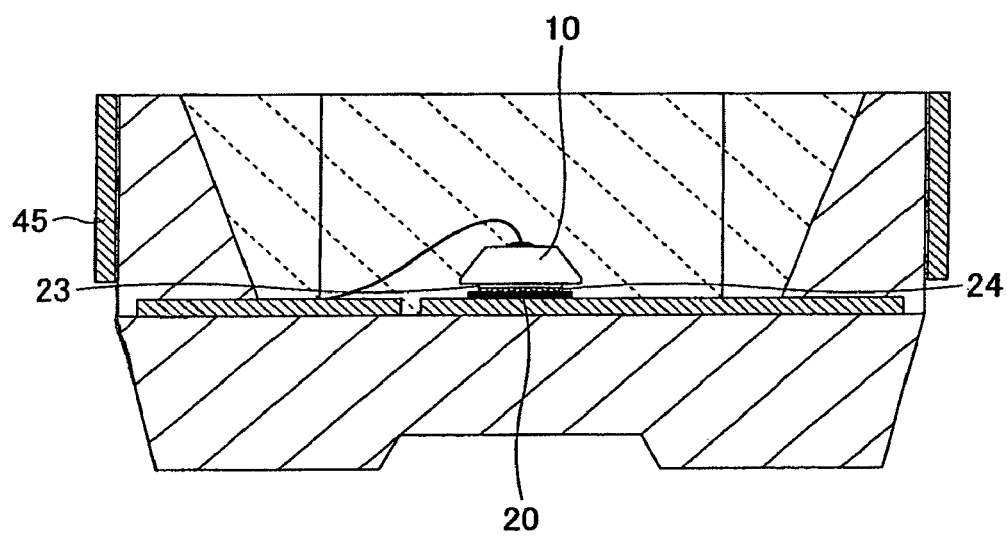

After Ag plating, as illustrated in FIGS. 2(a) and 2(b), areas other than terminals are masked and the terminals are subjected to Au plating. FIG. 2(a) illustrates a state in which a plurality of substrates 25 of semiconductor light emitting devices 1 are disposed and formed (a state in which the plurality of semiconductor light emitting devices 1 are not yet cut into respective semiconductor light emitting devices 1). FIG. 2(b) illustrates enlarged one of the plurality of the substrates 25 of the semiconductor light emitting devices 1 illustrated in FIG. 2(a). In a method for fabricating the semiconductor light emitting device 1 of the present embodiment, Au plating is performed while openings are formed on areas on which the LED chips 10 are to be mounted, as illustrated in FIGS. 3(a) and 3(b). Consequently, it is possible to form the bonding sections 20 on the areas on which the LED chips 10 are to be mounted while performing Au plating on the terminals. Note that, thickness of Au plating preferably ranges 0.1 to 1 μm, but not limited to this range. As with FIGS. 2(a) and 2(b), FIG. 3(a) illustrates a state in which a plurality of semiconductor light emitting devices are disposed and formed (a state in which the plurality of semiconductor light emitting devices are not yet cut into respective semiconductor light emitting devices), and FIG. 3(b) illustrates enlarged one of the plurality of semiconductor light emitting devices illustrated in FIG. 3 (a).

Here, in order to improve adherence between Ag plating and Au plating, at least one other metal or metal compound may be disposed between the Ag plating and the Au plating. For example, Ni may be preferably used, but other material may also be used. Further, thickness of other metal or metal compound to be disposed between the Ag plating and the Au plating preferably ranges from 0.1 to 1 μm, but not limited to this range.

After forming the bonding section 20 by Au plating, as illustrated in FIGS. 4(a) and 4(b), the LED chip 10 is bonded (die-bonded). FIG. 4(a) illustrates a state in which the LED chip 10 is not yet die-bonded and FIG. 4(b) illustrates a state in which the LED chip 10 is already die-bonded. In the LED chip 10, a P-N junction 21 is close to a die-bonding surface. In die-bonding, as illustrated in FIG. 4(a), the LED chip 10 is positioned so as to correspond to the bonding section 20 and is moved in an arrow direction, and as illustrated in FIG. 4(b), the AuSn solder layer 24 is melted by heating and bonded with the bonding section 20.

Here, as illustrated in FIG. 4(a), the LED chip 10 generally has a maximum outline which is larger than an outline of an electrode (the electrode cannot be seen when seen from the above). Therefore, as illustrated in FIG. 4(b), it is preferable that the LED chip 10 completely covers the bonding section 20 while the electrode 23 of the LED chip 10 is positioned completely within an outline of the bonding section 20.

The above explanation is preferably applicable to a case where a difference in size between the outline of the LED chip 10 and the electrode 23 of the LED chip 10 is larger than a sum of Au pattern positioning accuracy (bonding section positioning accuracy) and die-bonding accuracy. Here, the bonding section positioning accuracy indicates a deviation from a position where the bonding section is to be originally disposed. By measuring positional relationship between Au pattern and Ag pattern, the bonding section positioning accuracy can be obtained based on a deviation of the positional relationship from original design values. Further, the die-bonding accuracy is a deviation from a position where the LED chip 10 is to be originally disposed. The die-bonding accuracy can be obtained by measuring positional relationship between the LED chip 10 and Ag pattern. The die-bonding accuracy indicates accuracy in placing the LED chip 10 in die-bonding (how close to a desired position the LED chip 10 is placed).

In a case where a difference in size between the outline of the LED chip 10 and the electrode 23 of the LED chip 10 is smaller than a sum of the Au pattern positioning accuracy and the die-bonding accuracy, the size of the bonding section 20 (Au pattern) is determined based on which of (i) avoidance of reflection of the bonding section 20 and (ii) a size of a bonding area of the bonding section 20 has higher priority. Namely, if it is necessary to avoid reflection of the bonding section 20, the bonding section 20 (Au pattern) is made small as required. As a result, a part of the electrode 23 does not serve for solder bonding, which is not a problem unless it is necessary to bond the whole surface of the electrode 23. If it is necessary to bond the whole surface of the electrode 23, Au pattern which is the bonding section 20 is made large as required. As a result, the bonding section 20 protrudes beyond the outline of the LED chip 10, which is not a problem if it is possible to ignore the influence on color tone of the semiconductor light emitting device 1.

As described above, in the present embodiment, Au is used for the bonding section 20 (material for a second metal plating). However, in a case where a difference in size between the outline of an LED chip and an electrode of the LED is smaller than a sum of Au pattern positioning accuracy and die-bonding accuracy and where it is necessary to avoid reflection of Au and to bond the whole surface of the electrode of the LED chip with the bonding section, metal plating may be performed by using silver white colored material as the bonding section 20, instead of using Au. Examples of the silver white colored material include rhodium plating, palladium plating, ruthenium plating, platinum plating, and white gold. These materials are inferior to Au in terms of costs and solder wetting, but unlike Ag, these materials are capable of being solder-bonded with AuSn without flux.

Figure 7:
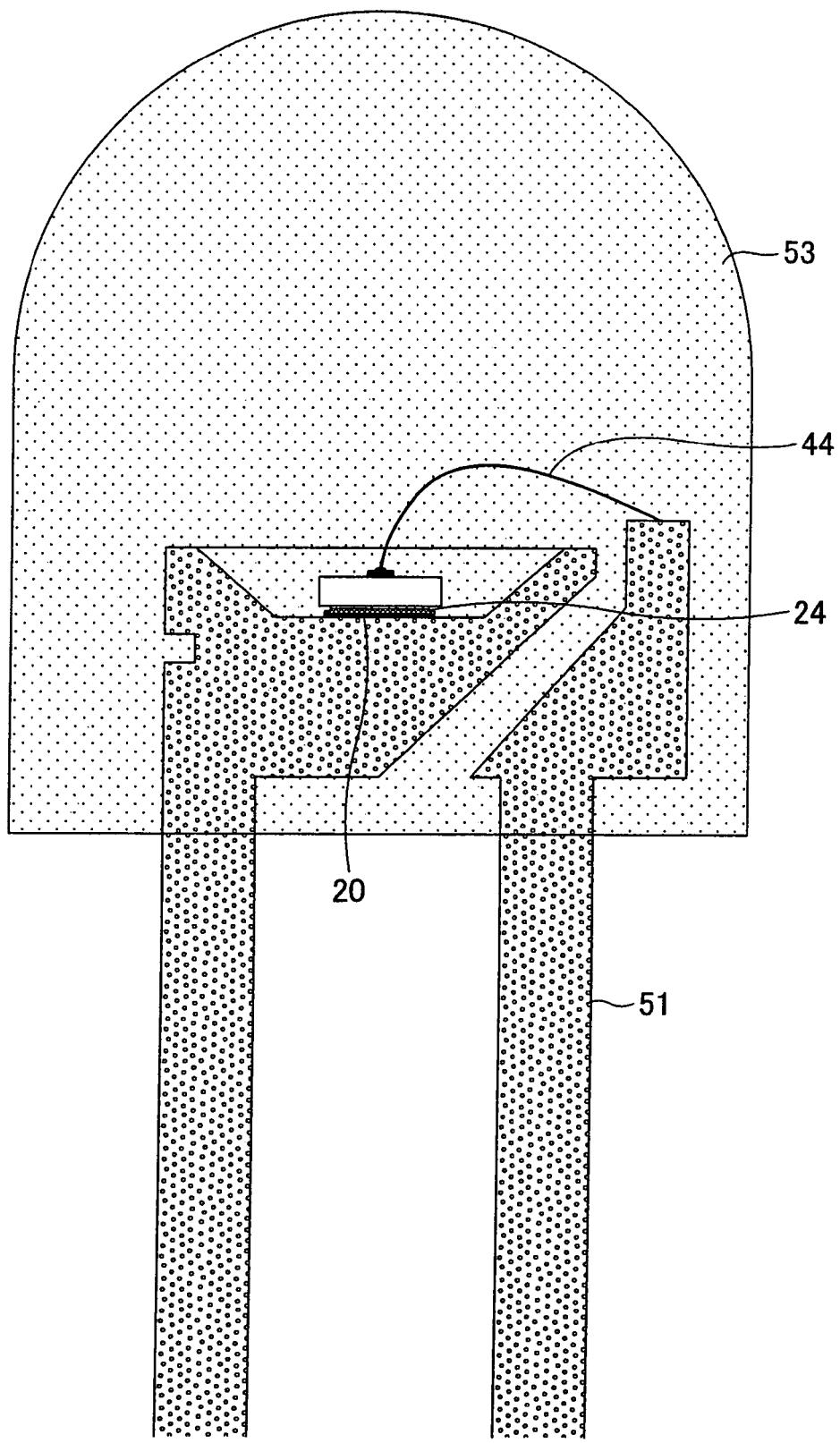
FIG. 7 is a cross sectional drawing illustrating a lamp-shaped semiconductor light emitting device of another embodiment of the present invention.
Figure 8:
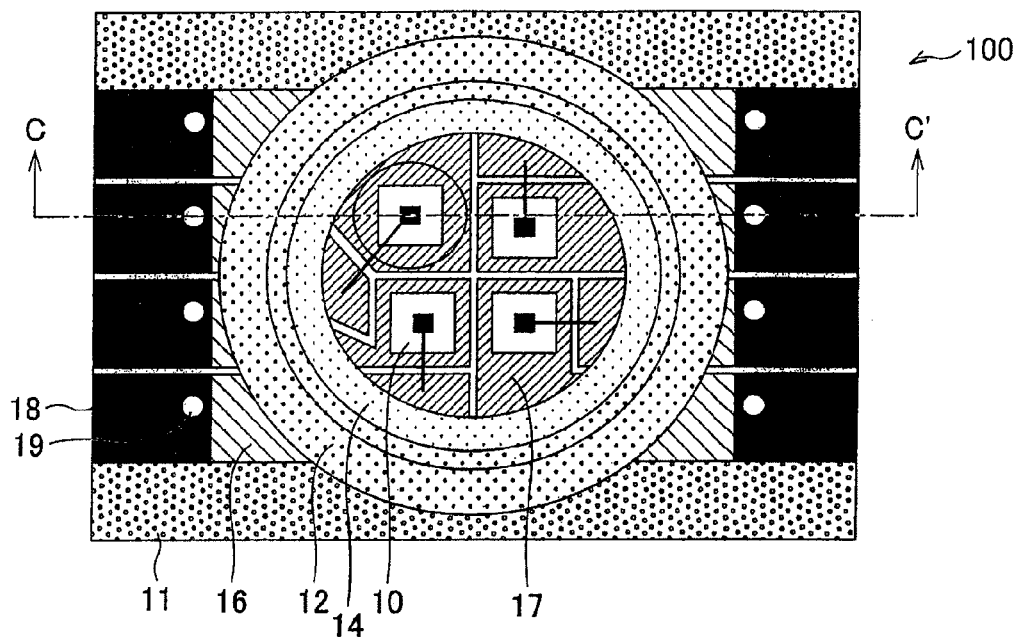
FIG. 8(a) is a top drawing illustrating a conventional semiconductor light emitting device.
FIG. 8(b) is a cross sectional drawing taken in an arrow line of the semiconductor light emitting device in FIG. 8(a).
Figure 8:
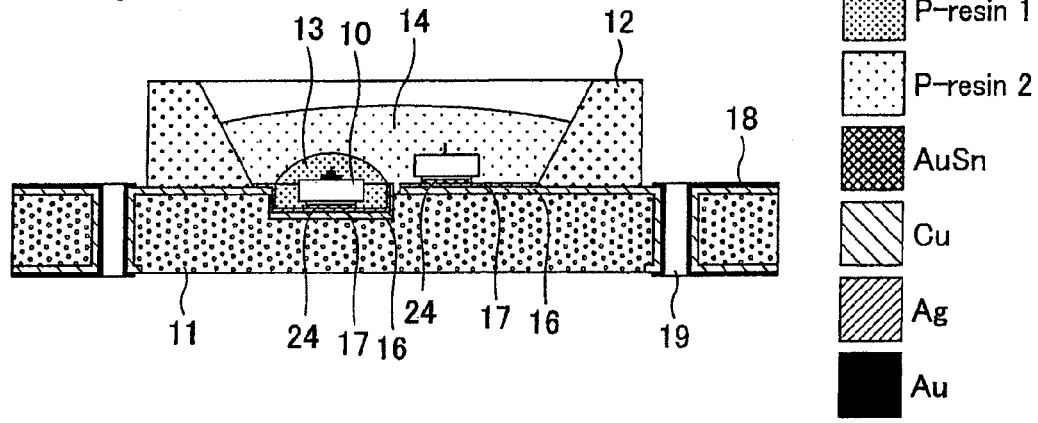
Figure 9:
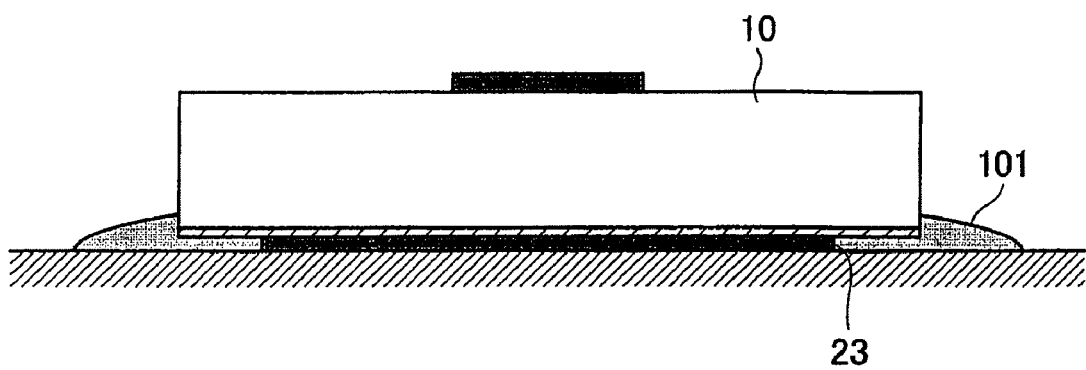
FIG. 9 is an explanatory drawing illustrating a case where the conventional semiconductor light emitting device is subjected to die-bonding by use of Ag paste.
Figure 10:
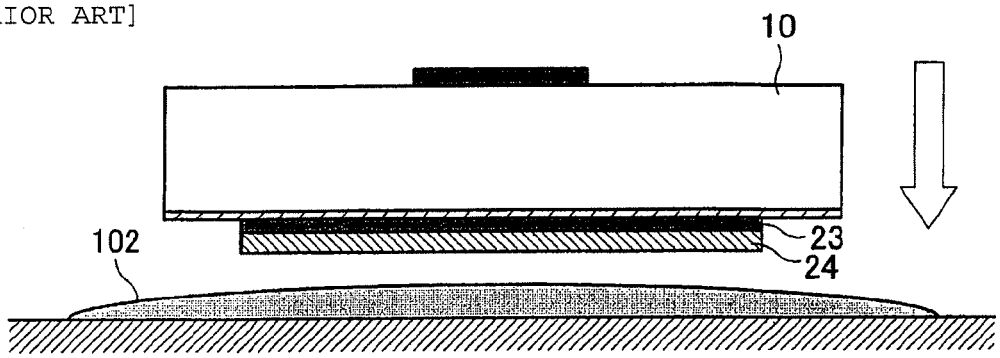
FIG. 10(a) is a drawing illustrating the conventional light emitting device before being subjected to die-bonding by use of flux.
FIG. 10(b) is a drawing illustrating the conventional light emitting device in the middle of die-bonding by use of flux.
FIG. 10(c) is a drawing illustrating the conventional light emitting device after being subjected to die-bonding by use of flux.
Figure 10:
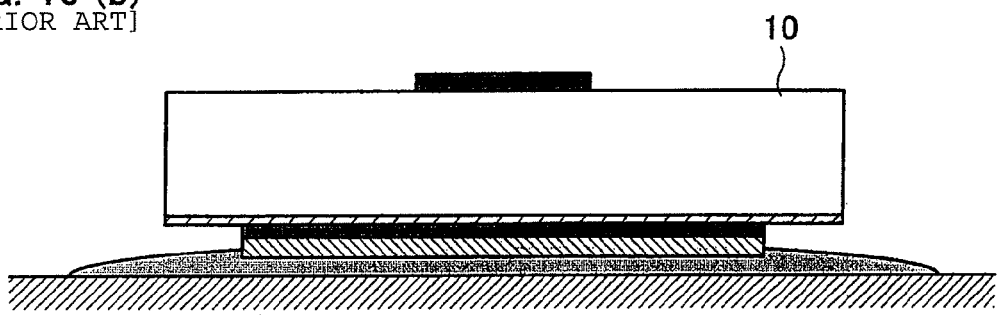
Figure 10:
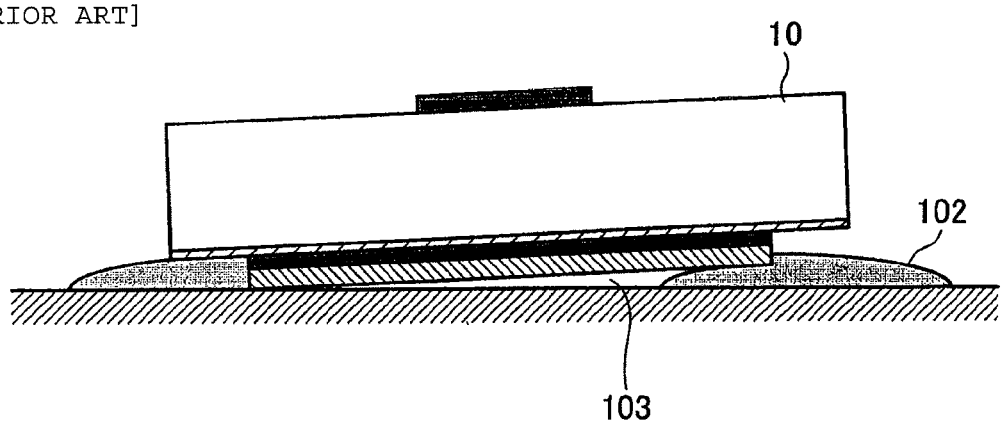

The semiconductor light emitting device of the present invention is not limited to the arrangements and shapes of the above embodiment. For example, by using a semiconductor light emitting device as illustrated in FIGS. 5(a) and 5(b) in which resin is inserted and molded in a metal frame, or by using a semiconductor light emitting device as illustrated in FIGS. 6(a) and 6(b) in which light is emitted in a side direction, or by using a semiconductor light emitting device having a lamp shape as illustrated in FIG. 7, the same effect can be obtained. Namely, it is possible to obtain a semiconductor light emitting device which has a semiconductor light emitting element firmly bonded with a bonding surface and which is capable of emitting light while reducing deterioration in luminosity and color tone shift.

Note that, FIG. 5(b) is a cross sectional drawing taken in B-B' line of FIG. 5(a). In the semiconductor light emitting device illustrated in FIGS. 5(a) and 5(b), insulating resin is inserted and molded in a metal frame made of Cu. The insulating resin surrounds an area on which an LED chip is to be mounted and the insulating resin fixes a metal frame, allowing the semiconductor light emitting device to be integrally provided. Further, Cu is plated with Ag which is first plating constituting a reflective layer, and the area on which the light emitting element is to be mounted and an external terminal connecting section are plated with Au. Note that, the plated external terminal connecting section may be formed outside the insulating resin which fixes the metal frame.

Further, FIG. 6(a) is an oblique drawing illustrating a semiconductor light emitting device in which light is emitted in a side direction. FIG. 6(b) is a cross sectional drawing illustrating the semiconductor light emitting device in FIG. 6(a). In the semiconductor light emitting device illustrated in FIGS. 6(a) and 6(b) in which light is emitted in a side direction, an LED chip 10 is surrounded by an insulating resin 49 and a surface surrounding the LED chip 10 is a light-transmitting resin 43. Further, an external terminal connecting terminal 45 has a surface, plated with Ag, which is provided so as to be perpendicular to an area on which an LED chip is to be mounted (light-emitting-element-mounting area). Further, the LED chip 10 is wire-bonded by a metal line 44. Further, a bonding surface is provided with a bonding section 20 made of Au, and the bonding section 20 is bonded with a die-bonding-side electrode 23 of the LED chip 10 via a solder layer 24.

Further, in the semiconductor light emitting device having a lamp shape as illustrated in FIG. 7, an LED chip 10 is mounted on a lead frame 51. The LED chip 10 is provided on a bottom section of a cup formed on the lead frame 51. Further, the LED chip 10 is wire-bonded by a metal line 44. Further, a bonding surface is provided with a bonding section 20 made of Au, and the bonding section 20 is bonded with a die-bonding-side electrode 23 of the LED chip 10 via a solder layer 24.

Further, in a case where a Cu wiring pattern is completely covered with Ag plating which is a reflective layer, white or silver resin may be applied onto a part where a first insulating resin is exposed. In a case where a Cu wiring pattern is exposed from Ag plating which is a reflective layer, white or silver resin may be applied onto a part where the Cu wiring pattern is exposed, or may be applied onto an LED-chip-1O-mounting area other than a metal layer. By applying white or silver resin as described above, it is possible to increase an extraction efficiency of light emitted by the LED chip 10. The semiconductor light emitting device may be arranged so that: there is provided light-transmitting resin which covers the LED chip 10 and the cup and whose end has a spherical shape, and an external terminal connecting section having been plated is formed on a lead frame provided outside the light-transmitting resin.

As described above, the semiconductor light emitting device of the present invention includes: a semiconductor light emitting element, mounted on a bonding surface; and a reflective layer, formed on the bonding surface, for reflecting light emitted by the semiconductor light emitting element, the bonding surface having thereon a light-emitting-element-mounting area on which a bonding section is formed, and the bonding section being made of a material allowing an electrode of the semiconductor light emitting element to be soldered on the reflective layer without flux.

The semiconductor light emitting device of the present invention may be arranged so that: the reflective layer is made of silver and the bonding section is made of any one of gold, rhodium, palladium, ruthenium, platinum, and white gold.

With the arrangement, the reflective layer can efficiently reflect light emitted by the semiconductor light emitting element. Further, it is possible to provide a semiconductor light emitting device in which a semiconductor light emitting element is soldered without flux on a bonding surface at a bonding section.

In addition to the arrangement, the semiconductor light emitting device of the present invention may be arranged so that: the bonding section has a surface which faces the semiconductor light emitting element and which has a larger shape than a surface of the electrode which surface faces the bonding section.

With the arrangement, the bonding section has a surface which faces the semiconductor light emitting element and which has a larger shape than the surface of the electrode which surface faces the bonding section, so that it is possible to bond the whole surface of the electrode of the semiconductor light emitting element with the bonding section. Consequently, it is possible to provide a semiconductor light emitting device in which an electrode is firmly soldered.

In addition to the arrangement, the semiconductor light emitting device of the present invention may be arranged so that: the bonding section has a surface which faces the semiconductor light emitting element and which has a smaller shape than a surface of the semiconductor light emitting element which surface faces the bonding section.

With the arrangement, the bonding section has a surface which faces the semiconductor light emitting element and which has a smaller shape than the surface of the semiconductor light emitting element which surface faces the bonding section, so that the bonding section can be hidden by the semiconductor light emitting element from a direction in which light is extracted. Therefore, it is possible to avoid reflection of light at the bonding section.

In addition to the arrangement, the semiconductor light emitting device of the present invention may be arranged so that a metal film is attached to a first insulating resin layer so that: the metal film and the first insulating resin layer integrally constitute a substrate, the substrate has a surface, on a side of the metal film, which constitutes the bonding surface, and the light-emitting-element-mounting area is made by patterning the metal film.

With the arrangement, it is possible to solder, without flux, the semiconductor light emitting element to the substrate in which a wiring pattern made of the metal film is attached to the first insulating resin layer so that the wiring pattern and the first insulating resin layer integrally constitute the substrate. Therefore, it is possible to obtain a semiconductor light emitting device having a substrate shape, which has a semiconductor light emitting element firmly bonded with a bonding surface and which is capable of emitting light while reducing deterioration in luminosity and color tone shift.

In addition to the arrangement, the semiconductor light emitting device of the present invention may be arranged so that: a metal film is attached to a ceramic substrate so that the metal film and the ceramic substrate integrally constitute a substrate, the substrate has a surface, on a side of the metal film, which constitutes the bonding surface, and the light-emitting-element-mounting area is made by patterning the metal film. Ceramic has high uniformity in thermal dilatability and therefore advantageous in a case where high accuracy is needed in patterning. To be specific, a ceramic substrate has high uniformity in an in-plane expansion coefficient unlike an insulating substrate such as a glass-epoxy substrate and therefore it is easy to make an electrode pattern requesting accuracy in size on the ceramic substrate even if there is an influence of temperature history of a process.

Here, if the ceramic substrate has a high thermal conductivity, the ceramic substrate is preferably applicable to a semiconductor light emitting element being a heating element. For example, a thermal conductivity of the ceramic substrate is preferably 50 W/mK or more, and further preferably 100 W/mK or more.

In addition to the arrangement, the semiconductor light emitting device of the present invention may be arranged so that: a second insulating resin layer is attached to the substrate on a side of the metal film, the second insulating resin layer having an opening in the light-emitting-element-mounting area.

With the arrangement, by attaching the second insulating resin layer around the light-emitting-element-mounting area, it is possible to increase strength of the substrate.

In addition to the arrangement, the semiconductor light emitting device of the present invention may be arranged so as to further include a resin for surrounding the light-emitting-element-mounting area and for fixing a metal thin plate which has been patterned and which has a surface constituting the bonding surface, the resin allowing the semiconductor light emitting device to be integrally provided.

With the arrangement, it is possible to solder, without flux, the semiconductor light emitting element to the metal thin plate on the resin. Therefore, it is possible to provide a semiconductor light emitting device, allowed by resin to be integrally provided, which has a semiconductor light emitting element firmly attached to a bonding surface and which is capable of emitting light while reducing deterioration in luminosity and color tone shift.

In addition to the arrangement, the semiconductor light emitting device of the present invention may be arranged so that: the semiconductor light emitting element is provided on a bottom section of a cup formed on a lead frame which has a surface constituting the bonding surface.

With the arrangement, it is possible to solder, without flux, the semiconductor light emitting element onto the lead frame. Therefore, it is possible to provide a semiconductor light emitting device, serving as an LED lamp, which has a semiconductor light emitting element firmly attached to a bonding surface and which is capable of emitting light while reducing deterioration in luminosity and color tone shift.

In addition to the arrangement, the semiconductor light emitting device of the present invention may be arranged so as to further include an external terminal connecting section for connection with an external terminal, a surface of the external terminal connecting section being provided so as to be perpendicular to the light-emitting-element mounting area on the bonding surface.

With the arrangement, the surface of the external terminal connecting section is provided so as to be perpendicular to the light-emitting-element mounting area on the bonding surface, so that it is possible to illuminate a surface parallel to the surface of the external terminal connecting section. Therefore, by using the semiconductor light emitting device having the arrangement as a back light of a liquid crystal display, it is possible to illuminate a liquid crystal panel from a surface which is parallel to the external terminal connecting surface and which is illuminated by the semiconductor light emitting device having the arrangement. If the surface which is parallel to the surface of the external terminal connecting section is arranged so that density of extracted light is uniform, it is possible to cause the whole of the liquid crystal display to uniformly emit light by providing a side of four sides of the liquid crystal display with the semiconductor light emitting device having the arrangement. Further, it is possible to illuminate the surface which is parallel to the surface of the external connecting section, so that it is possible to make a whole thickness of the semiconductor light emitting device thin. As described above, the semiconductor light emitting device of the present invention can be used as a semiconductor light emitting device in which light is emitted in a side direction. It is possible to obtain a semiconductor light emitting device in which light is emitted in a side direction, which has a semiconductor light emitting element firmly attached to a bonding surface and which is capable of emitting light while reducing deterioration in luminosity and color tone shift.

The semiconductor light emitting element of the present invention may be a semiconductor light emitting element, used for the semiconductor light emitting device, wherein an AuSn alloy film is formed on a surface, facing the bonding section, of an electrode of the semiconductor light emitting element.

The semiconductor light emitting element having the arrangement can be applicable to any one of the semiconductor light emitting devices. Because the AuSn alloy film is formed on the electrode, it is possible to bond the semiconductor light emitting element with the bonding section of the bonding surface.

In addition to the arrangement, the semiconductor light emitting element of the present invention may be arranged so that: the surface of the electrode which surface faces the bonding section has a smaller shape than that of a surface of the bonding section which surface faces the electrode, and the semiconductor light emitting element has a peripheral part which faces the bonding section and which is provided more externally than a surface of the bonding section which surface faces the semiconductor light emitting element.

With the arrangement, even if mount positioning accuracy of the semiconductor light emitting element drops a little, it is possible to bond the semiconductor light emitting element with the bonding section via the whole of the electrode. Further, the bonding section bonded with the electrode can be hidden by the semiconductor light emitting element from a direction in which light is extracted. Therefore, it is possible to avoid reflection of light at the bonding section.

Note that, the semiconductor light emitting element may have a surface which faces the bonding section and which has a shape similar to that of a surface of the bonding section.

Further, the method of the present invention is a method for fabricating a semiconductor light emitting device in which a semiconductor light emitting element is mounted on a bonding surface, including the steps of: (i) forming, on the bonding surface, a reflective layer for reflecting light emitted by the semiconductor light emitting element; and (ii) forming a bonding section on a light-emitting-element-mounting area on the bonding surface, the bonding section being made of a material allowing an electrode of the semiconductor light emitting element to be soldered on the reflective layer without flux.

Here, the method of the present invention may be arranged so that the step (ii) is performed simultaneously with metal plating for an external terminal connecting section on the bonding surface. With the arrangement, it is possible to efficiently form the bonding section.

Further, the semiconductor light emitting device of the present invention may be expressed as follows: a semiconductor light emitting device, including a semiconductor light emitting element on a plane made of a metal, wherein first metal plating is formed on the metal surface of the plane, and second metal plating is formed on the first metal plating so as to be positioned on a semiconductor-light-emitting-element-mounting area of the plane.

Further, in addition to the arrangement, the semiconductor light emitting device of the present invention may be expressed as a semiconductor light emitting device, wherein third metal plating is formed on a terminal section of the metal for connection with an external electrode.

Further, in addition to the arrangement, the semiconductor light emitting device of the present invention may be expressed as a semiconductor light emitting device, wherein the first metal plating is Ag plating and the second metal plating is any one of Au plating, rhodium plating, palladium plating, ruthenium plating, platinum plating, and white gold plating.

Further, in addition to the arrangement, the semiconductor light emitting device of the present invention may be expressed as a semiconductor light emitting device wherein the third metal plating is Au plating.

Further, in addition to the arrangement, the semiconductor light emitting device of the present invention may be expressed as a semiconductor light emitting device, wherein the metal is a metal layer, a first insulating resin layer is attached to the metal layer so that the first insulating resin layer and the metal layer integrally constitute a substrate, and the semiconductor-light-emitting-element-mounting area is made by patterning the metal layer. Here, a ceramic substrate having a high thermal conductivity may be used instead of the first insulating resin layer. The thermal conductivity of the ceramic substrate is preferably 50 W/mK or more, and further preferably 100 W/mK or more.

Further, in addition to the arrangement, the semiconductor light emitting device of the present invention may be expressed as a semiconductor light emitting device to which a second insulating resin is attached, the second insulating resin having an opening in the semiconductor-light-emitting-element-mounting area on a side of the metal layer.

Further, in addition to the arrangement, the semiconductor light emitting device of the present invention may be expressed as a semiconductor light emitting device, wherein white or silver resin is applied onto a part of a surface of the metal layer which surface has been patterned or onto a surface other than that of the metal layer on the side of the metal layer.

Further, in addition to the arrangement, the semiconductor light emitting device of the present invention may be expressed as a semiconductor light emitting device wherein a plurality of semiconductor-light-emitting-element-mounting areas are provided.

Further, in addition to the arrangement, the semiconductor light emitting device of the present invention may be expressed as a semiconductor light emitting device, wherein at least one of the semiconductor light emitting elements mounted on the semiconductor-light-emitting-element-mounting areas is covered with light-transmitting resin including a fluorescent substance which absorbs light emitted by the semiconductor light emitting element and emits light having a longer wavelength.

Further, in addition to the arrangement, the semiconductor light emitting device of the present invention may be expressed as a semiconductor light emitting device, wherein the semiconductor light emitting elements mounted on the semiconductor-light-emitting-element-mounting areas are sealed by light-transmitting resin on the mounting areas so as to be integrally provided.

Further, in addition to the arrangement, the semiconductor light emitting device of the present invention may be expressed as a semiconductor light emitting device wherein the light-transmitting resin partially covers, in an opening, a side of an opening of the second insulating resin.

Further, in addition to the arrangement, the semiconductor light emitting device of the present invention may be expressed as a semiconductor light emitting device, wherein the metal layer attached to the first insulating resin layer is regarded as a first metal layer, a second metal layer is provided on a surface of the first insulating resin layer so as to be opposite to the surface to which the first metal layer is attached, the first metal layer and the second metal layer are electrically connected with each other via a through hole, and the third metal plating is formed on a surface of the second metal layer.

Further, in addition to the arrangement, the semiconductor light emitting device of the present invention may be expressed as a semiconductor light emitting device, wherein the metal layer is a metal thin plate having been patterned so as to be a plurality of areas, there is provided resin which surrounds the semiconductor-light-emitting-element-mounting area and fixes the metal thin plate having been patterned, and the resin allows the semiconductor light emitting device to be integrally provided.

Further, in addition to the arrangement, the semiconductor light emitting device of the present invention may be expressed as a semiconductor light emitting device, wherein the third metal plating is provided on the metal thin plate so as to be outside the resin fixing the metal thin plate.

Further, in addition to the arrangement, the semiconductor light emitting device of the present invention may be expressed as a semiconductor light emitting device, wherein the metal layer is a first lead made of a metal and the semiconductor light emitting element is provided on a bottom section of a cup formed on the first lead.

Further, in addition to the arrangement, the semiconductor light emitting device of the present invention may be expressed as a semiconductor light emitting device, wherein there is formed light-transmitting resin which covers the semiconductor light emitting element and the cup and whose end has a spherical shape, and the third metal plating covers the first lead and a second lead so as to be outside the light-transmitting resin.

Further, in addition to the arrangement, the semiconductor light emitting device of the present invention may be expressed as a semiconductor light emitting device, wherein the surface of the semiconductor-light-emitting-element-mounting area of the metal layer is perpendicular to the surface of the external terminal connecting section.

Further, the semiconductor light emitting element of the present invention may be expressed as a semiconductor light element used for any one of the above semiconductor light emitting devices, wherein an AuSn alloy film is formed on a top surface of the semiconductor light emitting element which top surface faces a surface on which the semiconductor-light-emitting-element is to be mounted.

Further, in addition to the arrangement, the semiconductor light emitting element of the present invention may be expressed as a semiconductor light emitting element, wherein an electrode forming section made of the AuSn alloy film is narrower than the second metal plating forming section, and is positioned within a peripheral part of the surface of the semiconductor light emitting element which surface faces the surface on which the semiconductor-light-emitting-element is to be mounted.

Further, in addition to the arrangement, the semiconductor light emitting element of the present invention may be expressed as a semiconductor light emitting element, wherein the surface of the semiconductor light emitting element which surface faces the surface on which the semiconductor-light-emitting-element is to be mounted has a size similar to that of the second metal plating.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

With the present invention, it is possible to provide a semiconductor light emitting device with high quality, which has a semiconductor light emitting element firmly bonded with a bonding surface and which is capable of emitting light while reducing deterioration in luminosity and color tone shift. The present invention can be applicable to a small illuminating device, a liquid crystal back light, and a camera flash for example.

What is claimed is:

1. A semiconductor light emitting device, comprising:
a semiconductor light emitting element comprising an electrode;
a wiring pattern formed as part of a surface of a substrate;
a reflective layer formed on the wiring pattern and configured to reflect light emitted by the semiconductor light emitting element; and
a bonding section formed on the reflective layer and comprising an electrically conductive material soldered without flux to the electrode of the semiconductor light emitting element,
the number of the semiconductor light emitting element being equal to the number of the bonding section.

2. The semiconductor light emitting device as set forth in claim 1, wherein the reflective layer comprises silver and the bonding section comprises any one of gold, rhodium, palladium, ruthenium, platinum, and white gold.

3. The semiconductor light emitting device as set forth in claim 1, wherein the bonding section has a surface which faces the semiconductor light emitting element and which has a larger area than a surface of the electrode which faces the bonding section.

4. The semiconductor light emitting device as set forth in claim 1, wherein the bonding section has a surface which faces the semiconductor light emitting element and which has a smaller area than a surface of the semiconductor light emitting element which faces the bonding section.

5. The semiconductor light emitting device of claim 4, wherein the reflective layer has a surface which faces the semiconductor light emitting element and which has a larger area than the surface of the bonding section which faces the semiconductor light emitting element.

6. The semiconductor light emitting device of claim 4, wherein the reflective layer has a surface which faces the semiconductor light emitting element and which has a larger area than the surface of the semiconductor light emitting element which faces the bonding section.

7. The semiconductor light emitting device of claim 4, wherein the reflective layer has a surface which (i) faces the semiconductor light emitting element and (ii) has a larger area than a surface of the semiconductor light emitting element which faces the reflective layer.

8. The semiconductor light emitting device as set forth in claim 1, wherein the wiring pattern is attached to a first insulating resin layer so that the wiring pattern and the first insulating resin layer integrally constitute the substrate.

9. The semiconductor light emitting device as set forth in claim 8, wherein a second insulating resin layer is attached to the substrate on a side of the wiring pattern, the second insulating resin layer having an opening in an area including the bonding section.

10. The semiconductor light emitting device as set forth in claim 1, wherein the wiring pattern is attached to a ceramic substrate so that the wiring pattern and the ceramic substrate integrally constitute the substrate.

11. The semiconductor light emitting device as set forth in claim 10, wherein the ceramic substrate has a thermal conductivity of 50W/mK or more.

12. The semiconductor light emitting device as set forth in claim 1, further comprising a resin for surrounding an area including the bonding section and for fixing the wiring pattern, the resin allowing the semiconductor light emitting device to be integrally provided.

13. The semiconductor light emitting device as set forth in claim 1, wherein the semiconductor light emitting element is provided on a bottom section of a cup formed on a lead frame.

14. The semiconductor light emitting device as set forth in claim 1, further comprising an external terminal connecting terminal for connection with an external terminal and perpendicular to the wiring pattern.

15. A semiconductor light emitting element, used for the semiconductor light emitting device as set forth in claim 1, wherein an AuSn alloy film is formed on a surface of the electrode of the semiconductor light emitting element that faces the bonding section.

16. The semiconductor light emitting element as set forth in claim 15, wherein
the surface of the electrode which faces the bonding section has a smaller shape than that of a surface of the bonding section which faces the electrode, and
a surface of the semiconductor light emitting element which faces the bonding section extends farther than a surface of the bonding section which faces the semiconductor light emitting element.

17. The semiconductor light emitting element as set forth in claim 15, wherein the semiconductor light emitting element has a surface, facing the bonding section, which has a rectangular shape similar to a surface of the bonding section which has a rectangular shape and faces the semiconductor light emitting element.

18. The semiconductor light emitting device of claim 1, wherein (i) the electrode is on a lower surface of the semiconductor light element and (ii) the semiconductor light emitting element comprises a second electrode on an upper surface thereof.

19. The semiconductor light emitting device as set forth in claim 1, wherein:
before the semiconductor light emitting element is bonded to the bonding section, the semiconductor light emitting element has solder on its bonding surface and has an Au layer on a surface of the solder.

20. A method for fabricating a semiconductor light emitting device in which a semiconductor light emitting element comprising an electrode is mounted on a wiring pattern formed on a substrate, comprising the steps of:
(i) forming directly on and in physical contact with the wiring pattern a reflective layer for reflecting light emitted by the semiconductor light emitting element;
(ii) forming a bonding section on the reflective layer, the bonding section comprising an electrically conductive material capable of being soldered without flux;
(iii) soldering without flux the electrode of the semiconductor light emitting element to the bonding section,
wherein the number of the semiconductor light emitting element is equal to the number of the bonding section.

21. The method as set forth in claim 20, wherein the step (ii) is performed simultaneously with metal plating for an external terminal connecting terminal.

* * * * *